(12) United States Patent
Spencer

(10) Patent No.: US 8,983,416 B1
(45) Date of Patent: Mar. 17, 2015

(54) ARBITER-BASED AUTOMATIC GAIN CONTROL

(75) Inventor: Ronald G. Spencer, Rockwall, TX (US)

(73) Assignee: CSR Technology Inc., San Jose, CA (US)

( * ) Notice: Subject to any disclaimer, the term of this patent is extended or adjusted under 35 U.S.C. 154(b) by 537 days.

(21) Appl. No.: 12/946,625

(22) Filed: Nov. 15, 2010

(51) Int. Cl.
*H04B 1/06* (2006.01)
*H04B 1/16* (2006.01)

(52) U.S. Cl.
USPC .............. 455/232.1; 455/234.2; 455/241.1; 455/245.2; 455/249.1; 455/253.2

(58) Field of Classification Search
CPC ...... H03G 3/3052; H03G 3/3068; H03G 3/30
USPC .................. 455/136, 138, 232.1, 234.1, 455/239.1–253.2, 234.2
See application file for complete search history.

(56) References Cited

U.S. PATENT DOCUMENTS

| | | | | |
|---|---|---|---|---|
| 6,498,927 | B2 * | 12/2002 | Kang et al. | 455/245.2 |
| 6,993,291 | B2 * | 1/2006 | Parssinen et al. | 455/67.11 |
| 7,440,738 | B2 * | 10/2008 | Zhang et al. | 455/234.1 |
| 7,548,738 | B2 * | 6/2009 | Srinivasan et al. | 455/232.1 |
| 8,433,274 | B2 * | 4/2013 | Mehrmanesh et al. | 455/234.2 |
| 2003/0162518 | A1 * | 8/2003 | Baldwin et al. | 455/253.2 |
| 2004/0097209 | A1 * | 5/2004 | Haub et al. | 455/242.1 |
| 2004/0229586 | A1 * | 11/2004 | Oshima et al. | 455/240.1 |
| 2007/0049228 | A1 * | 3/2007 | Fujishima et al. | 455/253.2 |
| 2007/0129034 | A1 * | 6/2007 | Adams et al. | 455/138 |
| 2007/0275686 | A1 * | 11/2007 | Stevenson et al. | 455/234.1 |
| 2008/0293370 | A1 * | 11/2008 | Wood | 455/250.1 |
| 2011/0235758 | A1 * | 9/2011 | Khoini-Poorfard et al. | 375/345 |

OTHER PUBLICATIONS

Microtune Product Brief, MT3511, "RF MicroDigitizer™ for Software Defined Radio", Copyright@ 1996-2009 Microtune, Inc., 2 pgs.

* cited by examiner

*Primary Examiner* — Simon Nguyen
(74) *Attorney, Agent, or Firm* — Norton Rose Fulbright US LLP

(57) ABSTRACT

A system and method employ an arbiter-based automatic gain control (AGC) for managing a series of power adjustment circuits, such as amplifiers and/or attenuators. A central arbiter is employed for managing each stage of a series of power adjustment circuits, rather than each stage solely managing itself via a localized control loop. In one embodiment, a system comprises a series of gain stages each having at least one power adjustment circuit, such as at least one attenuator or amplifier. A power detector may be implemented to detect the power level of the output signal of each gain stage, and communicate information about the detected power levels for each stage to a central arbiter. Based at least in part on the received information, the arbiter controls each of the gain stages in a coordinated fashion.

26 Claims, 7 Drawing Sheets

ARBITER-BASED AUTOMATIC GAIN CONTROL

CROSS-REFERENCE TO RELATED APPLICATIONS

Not applicable.

TECHNICAL FIELD

The following description relates generally to management of a series of power adjustment circuits, such as amplifiers and/or attenuators, and more particularly to arbiter-based automatic gain control (AGC) wherein a central (or master) arbiter device manages a series of power adjustment circuits.

BACKGROUND OF THE INVENTION

Various types of power or amplitude adjustment circuits may be employed in a system. The terms "amplitude" and "power" are generally used interchangeably herein, and so references to power are intended to likewise encompass amplitude. In many radio frequency (RF) circuits, for example, power adjustment circuitry, such as amplifiers and/or attenuators are often employed. The term "gain" generally refers to a measure of the ability of a power adjustment circuit to increase the power of a signal from the input to the output. It is usually defined as the mean ratio of the signal output of a power adjustment circuit to the signal input of the same circuit. It may also (or alternatively) be defined on a logarithmic scale, in terms of the decimal logarithm of the same ratio ("dB gain").

Generally, an amplifier (or "amp") refers to any device that changes (e.g., usually increases) the power of a signal. The relationship of the input to the output of an amplifier, usually expressed as a function of the input frequency, is called the transfer function of the amplifier, and the magnitude of the transfer function is termed the gain. In audio applications, amplifiers drive the speakers used in public address (PA) systems to make the audio content that is output louder, for example.

An attenuator generally refers to any electronic device that changes (e.g., usually reduces) the power of a signal without appreciably distorting its waveform. Variable attenuators may dynamically change the extent to which they alter (e.g., reduce) the power of a signal. Thus, by adjusting the attenuation to increase loss, an attenuator may effectively reduce the power (or gain) of a signal. On the other hand, by adjusting the attenuation to decrease the amount of loss, the attenuator may effectively increase its gain from one point in time to a next point in time. For instance, by reducing the amount of loss from a first point in time to a second point in time, the attenuator may be viewed as effectively increasing the power from that observed at the first point in time to that observed at the second point in time, even though the overall effect by the attenuator on a received input signal in both instances might be to reduce the power thereof in its output signal.

Accordingly, amplifiers and attenuators are two types of power adjustment circuits that may be employed for altering power (or gain) of a signal. In many applications a series of power adjustment stages (which may be referred to as a series of "gain" stages) are implemented, wherein the power of a signal propagating through the stages may be adjusted at any one or more of the stages. For instance, a series of power adjustment stages may each include an attenuator (or amplifier) for adjusting the power (or gain) of a signal. The series of power adjustment stages may be implemented, for example, to allow for finer control over adjustments made to the power of a signal, as is well-known in the art. As used herein, each power adjustment stage may be referred to as a "gain" stage, even though attenuators may be employed at some stages for potentially decreasing, rather than increasing, the power of an input signal. Accordingly, a "gain" stage is not limited to stages that increase the power of a signal received into the stage.

The control of a series of gain stages may pose several challenges, however, due in part to limited attenuation ranges which can cause downstream irreversible inter-modulation or blocking. When an attenuator runs out of gain or attenuation, the actions of upstream attenuators can create distortion or noise conditions that cannot be reversed in downstream attenuators. Because the power level being controlled at every point in the series of stages is the cumulative result of all prior (upstream) stages, the actions of upstream stages (or loops) can interfere with the ability of downstream stages (or loops) to control their local power level. The series of stages then become coupled and a bottom-up approach can lead to undesired behavior such as oscillations and non-optimum signal-to-noise and distortion (SINAD).

Automatic gain control (AGC) refers generally to an adaptive system found in many systems or electronic devices. In general, an AGC may autonomously (without requiring human input) control the settings/parameters of a power adjustment circuit for managing the amount of gain that it imparts to a signal. Typically, the average output signal level is fed back to adjust the gain to an appropriate level for a range of input signal levels. For example, without AGC the sound emitted from an AM radio receiver would vary to an extreme extent from a weak to a strong signal; the AGC effectively reduces the volume if the signal is strong and raises it when it is weaker. AGC algorithms often use a proportional-integral-derivative (PID) controller where the P term is driven by the error between expected and actual output amplitude.

In conventional systems that employ a series of gain stages, each stage includes a localized control loop that is specific to that stage's respective power adjustment circuit (e.g., attenuator), and such localized control loop acts only on information that is present locally (in its respective stage). However, the inventor(s) of the present application have recognized that such localized control loops for each stage may lead to problems or oscillations where one localized control loop desires to take some action that may have a negative impact on another downstream stage. Accordingly, because each gain stage conventionally controls itself individually based on its localized data, the overall impact on the series of gain stages may not be controlled or managed very well.

Consider, for example, a series of three (3) gain stages that each includes an attenuator. The attenuator of the first gain stage receives an input signal and produces a first attenuated output signal. The attenuator of the second gain stage then receives as input the first attenuated signal output by the first gain stage and produces a second attenuated output signal. Finally, the attenuator of the third gain stage receives as input the second attenuated signal output by the second gain stage and produces a third attenuated output signal. In general, each stage may have a localized control loop to try to produce an output signal that best addresses noise and distortion. For instance, each stage may attempt to keep the power high enough to reduce noise problems, while keeping the power low enough to minimize distortion.

Suppose now that, in the above example of the 3-stage series, the second attenuator observes that it has the range to increase the power of its output signal, which may be desirable from a pure localized view of that gain stage (e.g., to minimize its noise). However, further suppose that the attenuator in the third gain stage is set to its maximum attenuation such that it is unable to further reduce its output power. In this instance, the increased power output by the second stage may cause the third stage to incur distortion which the attenuator of such third stage is unable to address (because it is already set to its maximum attenuation).

In certain systems, there may be some communication channel that allows the third gain stage to notify the second gain stage that its output power is too high and is causing distortion that the third gain stage is unable to fix, and thereby request the second gain stage to reduce its output power. This type of situation, however, is the very definition of an oscillation. In other words, an upstream gain stage made a change that it did not predict could cause a problem in a downstream stage because the upstream gain stage decided to make the change based only on its local information. Because the change made upstream has to later be reversed in order to correct for the problem caused downstream, it results in an oscillation, rather than avoiding the upstream change in the first place.

BRIEF SUMMARY OF THE INVENTION

The present invention is directed to a system and method which employ an arbiter-based automatic gain control (AGC) for managing a series of power adjustment circuits, such as amplifiers and/or attenuators. For instance, a central (or master) arbiter is employed for managing each stage of a series of power adjustment circuits, rather than each stage solely managing itself via a localized control loop.

In one embodiment, a system comprises a series of gain stages each having at least one power adjustment circuit, such as at least one attenuator or amplifier. The system further comprises a central arbiter device for monitoring power output of a plurality of the gain stages and controlling a respective gain amount of a plurality of the gain stages. In one exemplary implementation, the series includes three gain stages that each have an attenuator. A power detector may be implemented to detect the power level of the output signal of each attenuator, and communicate information about the detected power levels for each attenuator/stage to the central arbiter. Based at least in part on the received information about the detected power levels, the arbiter controls each of the attenuators in a coordinated fashion. For instance, the arbiter can selectively instruct any one or more of the attenuators to increase or decrease its attenuation. Because the arbiter has a global view of the series of gain stages, it can determine/predict how best to improve performance within the series without causing unwanted problems downstream.

In one exemplary embodiment, a radio system comprises a front-end receiver for receiving a radio frequency (RF) signal, where the front-end receiver includes a series of gain stages each having at least one attenuator. The radio system also comprises a plurality of power detectors, each for detecting power output of a respective one of a plurality of the gain stages. The radio system also comprises a central arbiter device for controlling, based at least in part on the detected power output of the plurality of gain stages, attenuation of the attenuators.

According to another exemplary embodiment, a method comprises receiving, at a central arbiter device, information about power level of respective output signals for each of a series of gain stages, where each of the gain stages has at least one power adjustment circuit. The central arbiter device determines, based at least in part on the received information, whether to alter an amount of gain of one or more of the gain stages; and when determined to alter the amount of gain of one or more of the gain stages, the central arbiter device instructs the one or more gain stages to adjust its amount of gain.

In accordance with certain embodiments, the arbiter device may be implemented as a state machine. The state machine may comprise at least a state for collecting data about power output by a plurality of the gain stages, a state for choosing (based at least in part on the collected data) an action to instruct at least one of the gain stages to take, and a state for instructing at least one of the gain stages to take a chosen action.

In certain embodiments, the state machine is configured to instruct, at most, one action to be taken per cycle through a loop of its states. For instance, in one embodiment, only one action (e.g., either a gain increase or decrease instruction), at most, is communicated to the series of gain stages. In other embodiments, multiple actions may be permitted in a given cycle.

In certain embodiments, delays may be employed such that an action chosen in one cycle through the arbiter's states may not be taken in that cycle, but may instead be configured to require that the action be chosen in each of some number of consecutive cycles through the arbiter's states before the arbiter sends instruction(s) for the chosen action to be taken in the series of gain stages.

In certain embodiments, the actions that may be initiated by the arbiter are prioritized. For instance, priority may be given to distortion correcting actions over noise correcting actions. Further, distortion and noise correcting actions may be further prioritized from upstream to downstream in the series of gain stages. For instance, an action chosen for an upstream attenuator may be given priority, e.g., performed in a cycle before performing any action that might appear needed for a downstream attenuator. In implementations in which only one action, at most, is permitted per cycle through the states, giving priority in the above manner may be preferable as an upstream action may correct problems and/or alleviate further actions that might otherwise be needed downstream.

Certain disadvantages (e.g., oscillation) associated with conventional localized control loops employed in each stage of a series of gain stages have lead the inventor(s) of the present application to recognize the desirability for a top-down approach in which decisions or "actions" for a series of gain stages (e.g., as may be employed in a tuner) as a whole may be based on a combination of previous actions, current power levels, and the state of the entire series of gain stages. All available information about the series of gain stages may be considered by the centralized arbiter when making decisions in certain embodiments. The use of a central (or master) arbiter as proposed for embodiments of the present invention may allow the consequences of actions in each stage to be evaluated before execution, and may thus result in a well-organized control system that prevents oscillations, maximizes SINAD, and can report which action it took and why, in real-time.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

The word "exemplary" is used herein to mean "serving as an example, instance, or illustration." Any embodiment described herein as "exemplary" is not necessarily to be construed as preferred or advantageous over other embodiments.

Figure 1:
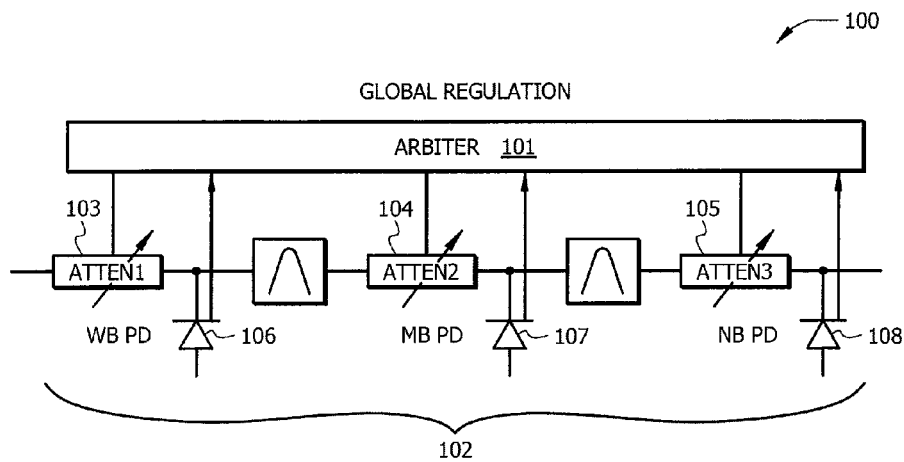
FIG. 1 shows an exemplary block diagram for one embodiment of the present invention.

FIG. 1 shows an exemplary block diagram for one embodiment of the present invention. In this system 100, a central (or master) arbiter device 101 is employed for managing each stage of in a series of power adjustment (or "gain") stages. Arbiter device 101 may include hardware (e.g., circuitry, logic gates, etc.) and, in some implementations, software stored to a computer-readable medium may execute (e.g., on a microprocessor of the arbiter) for performing some or all of the operations described herein. As discussed further with FIG. 3, arbiter device 101 may, in certain embodiments, be implemented as a state machine for controlling the amount of power adjustment made by individual ones of stages in a series of stages.

In the illustrated example of FIG. 1, a series 102 of power adjustment (or "gain") stages includes stages 103, 104, and 105. The series may be referred to herein as a "chain" of gain stages. Each stage includes an attenuator in this example, but one or more of the stages may instead include other types of power adjustment circuitry such as an amplifier in other implementations. Following each stage, a power detector is implemented, in this example. For instance, a power detector 106 is implemented following stage 103, which detects/measures the power of the signal output by stage 103. Similarly, power detectors 107 and 108 are implemented following stages 104 and 105, respectively (which each detects/measures the power of the signal output by their respective preceding stage).

While three (3) stages are shown in the illustrated example of FIG. 1, it will be understood that embodiments of the present invention are not limited to any specific number of stages, but rather any number of two or more stages may be included in any given implementation with each stage being managed by arbiter 101 in the manner described further herein. Further, while a power detector is shown as implemented following each stage 103-105 in this example, in other embodiments a power detector might not be implemented following each and every stage (e.g., as in the below example of FIG. 2).

Thus, the illustrated example of system 100 of FIG. 1 includes three power adjustment stages 103-105 (which may be referred to as "domains"). The first (or front-end) stage 103 is the widest in bandwidth, and so it is going to let through as much power as anywhere else in the series 102. Thus, power detector 106 may be referred to as a wide-band (or "WB") power detector. In an exemplary radio implementation, the first stage 103 may receive a signal corresponding to a received wireless radio frequency (RF) signal received (e.g., by an antenna). The second stage 104 in the series 102 can be adjusted to provide a medium power bandwidth. For instance, in this example, the attenuator of second stage 104 may reduce the power of the WB signal it receives from first stage 103 to produce a signal of medium bandwidth. Therefore, power detector 107 may be referred to as a medium-band (or "MB") power detector. The third stage 105 can be adjusted to provide a narrow power bandwidth. For instance, in this example, the attenuator of third stage 105 may reduce the power of the MB signal it receives from second stage 104 to produce a signal of narrow bandwidth. Therefore, power detector 108 may be referred to as a narrow-band (or "NB") power detector.

Rather than each stage solely managing itself via a localized control loop, as in conventional implementations, arbiter 101 provides a central manager for managing/controlling the actions of each stage 103-105 in a coordinated manner. Thus, with its "global" view of all stages 103-105, arbiter 101 may control the power adjustment (e.g., attenuation) at each stage in order to optimize each stage in a manner that does not negatively impact downstream stages (e.g., as to minimize/eliminate oscillation and maximize SINAD and to minimize clock feedthrough). In accordance with certain embodiments, a localized control loop may be omitted from each stage 103-105, and each stage may be managed solely by the centralized arbiter 101.

In other words, in this embodiment arbiter 101 effectively acts as a global regulatory body that has access to (or receives) information for each of the stages 103-105. For instance, information about the power detected by each of power detectors 106-108 may be provided to arbiter 101 so that arbiter 101 knows the power being output by each of the stages 103-105. The information provided to arbiter 101 about the power detected by each of power detectors 106-108 may be the raw power amount measured by the power detector and/or a characterized "level" of the measured power, such as low level, acceptable level, preferred level, and high level, as examples. Based at least in part on the power observed by the power detectors 106-108, the arbiter 101 may manage/control each power adjustment stage 103-105 in a fashion that benefits the entire system, rather than just one local stage. For instance, arbiter 101 may manage the power adjustment stages 103-105 in a coordinated fashion so as to maximize SINAD, while avoiding the unnecessary oscillations that commonly occur in conventional systems that rely solely on localized control loops for each stage (as discussed above). Accordingly, for instance, arbiter 101 has sufficient information to foresee that a certain amount of power increase in an upstream stage (e.g., in stage 103) may cause an undesirable negative impact (e.g., distortion) on a downstream stage (e.g., stage 105) which such downstream stage may be incapable of adequately addressing itself (e.g., it may be at its maximum attenuation), and thus arbiter 101 is able to avoid causing the upstream stage to make the amount of power increase (and thereby avoid the oscillation of later undoing the increase to resolve the downstream distortion that it causes).

Figure 2:
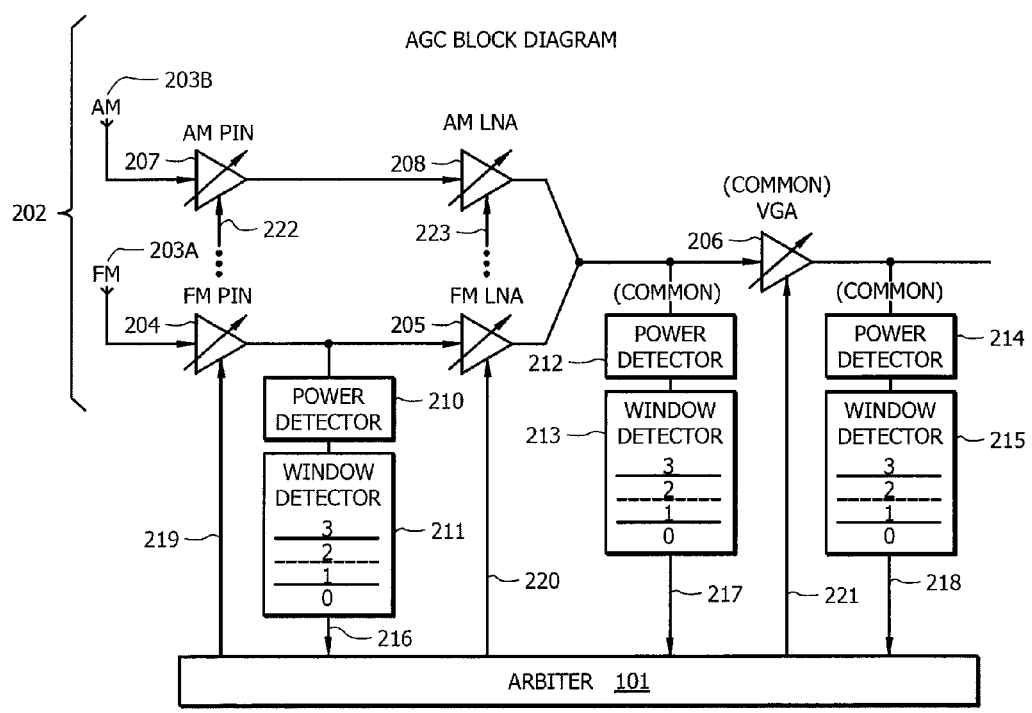
FIG. 2 shows a block diagram of an exemplary system for automatic gain control (AGC) in accordance with one embodiment of the present invention.

FIG. 2 shows a block diagram of an exemplary system 200 for automatic gain control (AGC) in accordance with one embodiment of the present invention. System 200 includes arbiter device 101 for managing/controlling a series 202 of power adjustment stages 204-208. In the illustrated example of FIG. 2, the exemplary AGC system 200 is implemented in a radio system, such as within a radio tuner. As one example, AGC system 200 may be implemented in a tuner, such as the MT3511 RF MicroDigitizer™ IC available from Microtune, Inc. (hereafter referred to as "the MT3511"), such as described in the product brief titled "MT3511 RF MicroDigitizer™ for Software Defined Radio" (available at http://www.microtune.com/pdf/Briefs/PB-00176.pdf), the disclosure of which is hereby incorporated herein by reference. As another example, AGC system 200 may be implemented in a tuner, such as the tuner as described in co-pending U.S. patent application Ser. No. 12/263,906 (now published as U.S. Patent Application Publication No. 2009/0058706) titled "Digital Radio System and Method of Operation" (hereafter "the '906 application"), the disclosure of which is hereby incorporated herein by reference. Of course, embodiments of the present invention are not restricted to implementation within a MT3511 tuner, the exemplary tuner described in the '906 application, or any other radio tuner, but may instead be employed within any other circuitry that includes a series of gain stages in order to manage/control those stages in a coordinated fashion as described further herein.

In the illustrated example of FIG. 2, an FM-band antenna 203A and an AM-band antenna 203B is included for receiving wireless radio signals (RF signals), as is well-known in the art. In this example, series 202 includes a first FM attenuator 204 (labeled "FM PIN") that receives as input a received FM-band signal. A second FM attenuator 205 (labeled "FM LNA") receives as input an output signal from the first FM attenuator 204. The first and second FM attenuators 204 and 205 may be referred to as first and second FM gain stages, respectively.

In parallel with the FM gain stages 204 and 205, series 202 includes a first AM attenuator 207 (labeled "AM PIN") that receives as input a received AM-band signal. A second AM attenuator 208 (labeled "AM LNA") receives as input an output signal from the first AM attenuator 207. The first and second AM attenuators 207 and 208 may be referred to as first and second AM gain stages, respectively.

The combined output from the second FM attenuator 205 and the second AM attenuator 208 is input to a third gain stage (referred to as a "common" gain stage, since it is common to both the FM and AM paths), which includes an attenuator 206 (labeled "VGA"). In the illustrated example, power detectors 210, 212, and 214 are implemented. Power detector 210 detects the power of the signal output by the first FM attenuator 204. Power detector 212 detects the power of the combined signal output by the second FM attenuator 205 and second AM attenuator 208. Power detector 214 detects the power of the signal output by attenuator 206.

Information about the power of the respective signals detected at power detectors 210, 212, and 214 is supplied (e.g., via communication 216-218, respectively) to arbiter 101. Based at least in part on the observed power detected at each power detector, arbiter 101 manages/controls each of the stages 204-208 (e.g., via control signals 219-223, respectively). For instance, arbiter 101 may, via control signals 219-223, control the amount of attenuation performed on a signal by each of the attenuators 204-208.

In the example of FIG. 2, information about the power detected by power detectors 210, 212, and 213 is communicated to arbiter 101 in the form of an indication of a power level within a predefined window. In other words, in the exemplary embodiment of FIG. 2, window detection is employed for each of the power detectors 210, 212, and 214. In this example, there are three primary reference levels per window detector 211, 213, and 215. The three primary reference levels are levels:

1) "low" (shown as level 0), 2) "acceptable" (shown as sub-levels 1 and 2), and 3) "high" (shown as level 3). In one specific implementation, each primary reference level is approximately 3 mV (approximately 3 dB) away from the previous primary reference level. Of course, other power values may be selected for each level, and such assigned values may vary from system to system.

In the example of FIG. 2, each window detector 21, 213, and 215 effectively categorizes the detected power (from power detector 210, 212, and 214, respectively) into one of levels 0-3. Level 3 is a primary reference level that indicates that the power is so high that it exceeds the acceptable window, resulting in distortion. Levels 1 and 2 are each sub-levels within a second primary reference level that is indicative of the power being within the acceptable window. Level 2 indicates that the power is within the acceptable window and is sufficiently high to be considered "good," while level 1 indicates that the power is not high enough to be considered "good" (as in category 2) but is sufficiently high to be OK or acceptable. Level 1 indicates that the power is so low that it falls below the acceptable window, resulting in noise.

Rather than each stage solely managing itself via a localized control loop as in conventional implementations, arbiter 101 provides a central manager for managing/controlling the actions of each stage 204-208 in a coordinated manner. Thus, with its "global" view of all stages 204-208, arbiter 101 may control the power adjustment (e.g., attenuation) at each stage in order to optimize each stage in a manner that does not negatively impact downstream stages (e.g., as to minimize/eliminate oscillation and maximize SINAD).

In other words, arbiter 101 effectively acts as a global regulatory body that has access to (or receives) information (e.g., the window detector information supplied via communications 216-218) for various points along the series of stages (e.g., at the power detectors 210, 212, and 214). In the example of FIG. 2 there are some points in the series of stages at which power information is not detected. For instance, a power detector is not implemented between the first AM attenuator 207 and the second AM attenuator 208. Of course, in other embodiments, a power detector may be implemented at additional points in the series (e.g., following each and every gain stage). Based at least in part on the information it receives (via communication 216-218), arbiter 101 may manage/control each power adjustment stage 204-208 in a fashion that benefits the entire system, rather than just one local stage. For instance, arbiter 101 may manage the power adjustment stages 204-208 in a coordinated fashion so as to maximize SINAD, while avoiding the unnecessary oscillations that commonly occur in conventional systems that rely solely on localized control loops for each stage (as discussed above).

Figure 3:
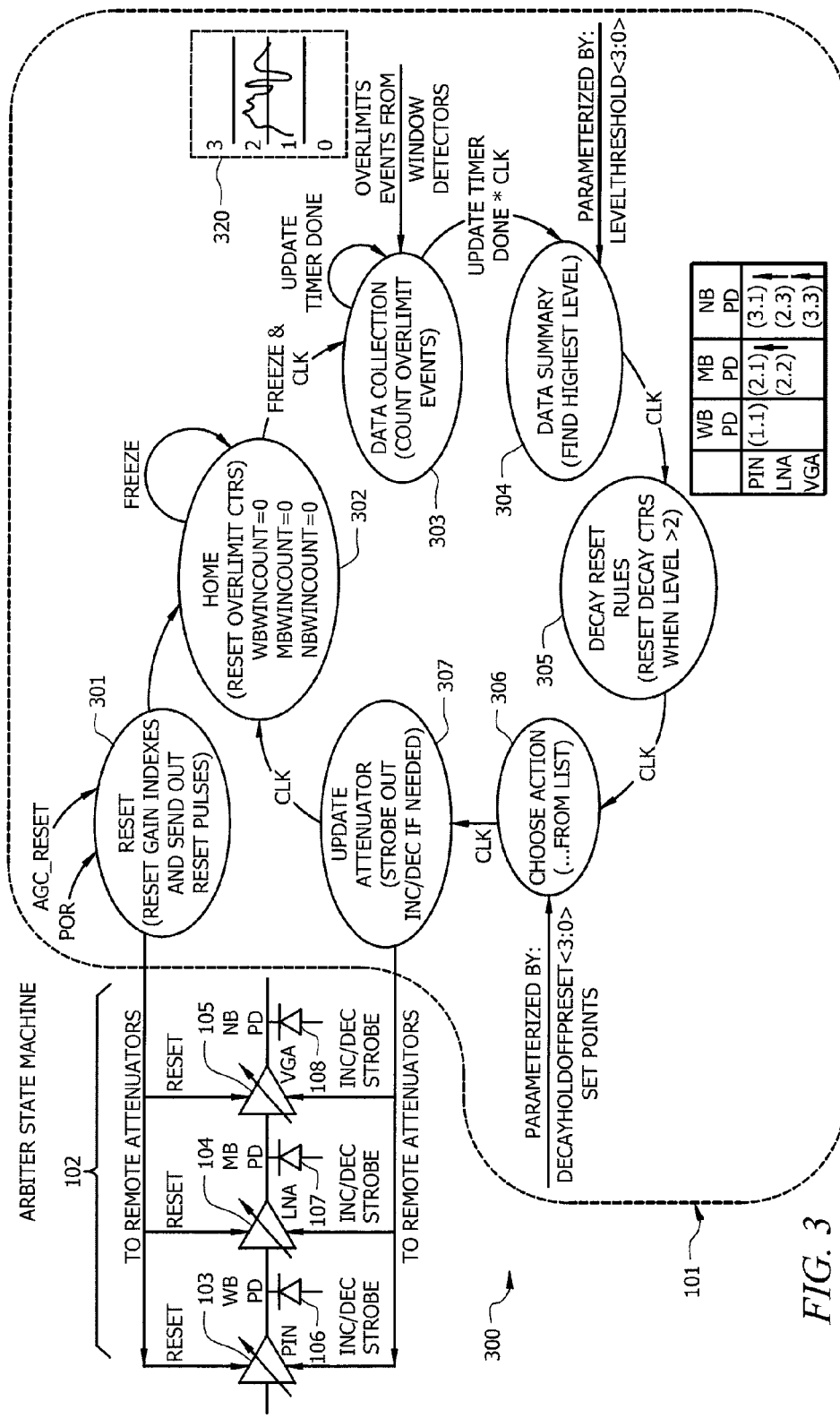
FIG. 3 shows an exemplary block diagram of a system in which a central arbiter device is implemented as a state machine, in accordance with one embodiment of the present invention.

In one embodiment, arbiter device 101 is implemented as a state machine, such as the exemplary state machine shown in system 300 of FIG. 3. System 300 of FIG. 3 shows a block diagram of an exemplary arbiter 101 implemented as a state machine for managing a series of gain stages, such as series 102 of FIG. 1. In the example of FIG. 3, the state machine includes a reset state 301 which leads into a loop of states 302-307. Such loop includes home state 302, data collection state 303, data summary state 304, decay holdoff state 305, choose action state 306, and update attenuator state 307. Each state 301-307 of this exemplary embodiment is described further below.

At power on or reset of the system, arbiter 101 goes to the reset state 301, during which, in this example, arbiter 101 sends out commands to all gain stages to set each one to a predefined level. For instance, in one embodiment, arbiter 101 sets all of attenuators 103-105 to their max gain in the reset state 301. Of course, in other embodiments, arbiter 101 may instead set all of the attenuators 103-105 to any other predefined values, such as to minimum gain.

In one embodiment, arbiter 101 may use any of various commands or control signals to communicate to the gain stages for controlling each stage. For instance, in one embodiment, arbiter 101 may use any of at least three control signals for controlling the stages: 1) a reset signal, 2) a strobe up signal, and 3) a strobe down signal. The reset signal may be sent from arbiter 101 to each of attenuators 103-105 during the reset state 301 to set each attenuator to a predefined base level (e.g., their maximum gain). Arbiter 101 may selectively communicate a strobe up or strobe down command to ones of attenuators 103-105 to adjust their respective gains or attenuation.

Following the reset state 301, arbiter 101 goes to home state 302. In one embodiment, the system may have a manual mode and an automatic mode. When configured in the manual mode, arbiter 101 may remain in the home state 302, whereby a user may then manually configure the settings of attenuators 103-105 rather than employing AGC by arbiter 101. When configured in automatic mode (e.g., for employing AGC), arbiter 101 advances from home state 302 to data collection state 303 where it begins collecting power information from power detectors 106-108. For instance, as discussed with FIG. 2 above, window detectors may be employed for communicating information indicating a corresponding level for the power detected by each power detector 106-108. Of course, the information about the detected power may be communicated in any of various different ways, including as an example employing an analog-to-digital (A/D) converter to digitize the power level and communicate the digital data to arbiter 101.

In one embodiment, a comparator is implemented for each power detector 106-108, and the comparator counts the number of times that the detected power fell into each of the various levels (e.g., levels 0-3 in the example of FIG. 2). So, over some period of time, arbiter 101 collects this power data information from power detectors 106-108 (and/or from window detectors 211, 213, and 215 of FIG. 2). Based, for instance, on the number of times the comparator counted the power level observed at each of power detectors 106-108 as falling within a given level, arbiter 101 can evaluate or characterize the power level (or gain) at each of power detectors 106-108. For instance, if arbiter 101 receives (from the comparator associated with power detector 106) a majority of counts for the power observed at power detector 106 as falling in level 2 with a few counts falling in level 1 (as illustrated by the exemplary waveform 320 in FIG. 3), arbiter 101 may determine that the output of stage 103 is not too low (level 0) and not too high (level 3). Further, arbiter 101 may determine that the output of stage 103 is consistently in level 2, which is the upper range of the acceptable level, and thus arbiter 101 may recognize that stage 3 may reduce its gain if needed to avoid downstream distortion.

In certain implementations, the state machine is in this data collection state 303 for a relatively long period of time (as compared with the relative amount of time spent in other states 304-307). Power detection may last for one "update period" (which may be referred to as the observation or sampling period) which may encompass several clock cycles, and then the arbiter 101 may take a few clock cycles to advance through states 304-307 and returns back to power detection and data collection in state 303.

In one implementation, as mentioned above, a respective comparator is implemented for each of power detectors 106-108, and the outputs from each comparator are communicated (e.g., via current mode logic or "CML") from each comparator (or window detector) to the arbiter 101, where they are sampled. For each comparator, the number of over-limit events is counted (e.g., the number of events in which power fell into level 0 or raised to level 3 in the exemplary window detector of FIG. 2) during the sampling period. Of course, the number of counts/samples in which the power was observed as falling within level 1 and within level 2 may also each be determined in the data collection state 303 (e.g., so that arbiter 101 has a good understanding of where the respective power level was during the sampling period as observed by each of the power detectors).

From the data collection state 303, arbiter 101 goes to data summary state 304. The data summary state 304 may process the data collected in collection state 303 in various ways. In some instances, filtering may be performed to effectively discount or remove collected data that may be attributable to noise. For instance, suppose that out of some number of data collection points, say 512, a little noise in the system caused one of the collection points to be counted in level 3. Rather than reacting on that one data collection point that is attributable to noise (or other system anomaly), the data summary state 304 may process the collected data to discount or remove such anomalous data collection point.

In one embodiment, the filtering performed by the data summary state 304 is parameterized or controlled by a levelThreshold parameter that may be defined for each power detector, as discussed further below. In this exemplary embodiment, data summary state 304 lasts for one clock cycle, during which the data points collected in data collection state 303 are effectively transformed into usable information (e.g., raw over-limit events are turned into a scalar). For instance, data summary state 304 turns the level counts (number of counts for which power was observed in each of levels 0-3 during the observation/data collection period of state 303) into a single scalar that indicates that the power observed at each power detector 106-108 is in level 0, 1, 2, or 3. A corresponding level is determined for each power detector 106-108. For example, data summary 304 may determine based on the data collected in state 303 for power detector 106 that stage 103 is outputting power at level 2, and data summary 304 may further determine based on the data collected in state 303 for power detector 107 that stage 104 is outputting power at level 1, and so on.

According to one embodiment, for each window detector the over-limit counter values are turned into a scalar that summarizes the power level observed by the corresponding power detector. In one embodiment, this process is configured by the corresponding levelThreshold value (e.g., via an inter-integrated circuit or I$^2$C interface in one exemplary implementation). In one embodiment, the default value for levelThreshold is 1; i.e., it only takes 1 over-limit event to conclude (or declare) that the power level is above that threshold, for the sake of making decisions. If this levelThreshold is increased, then it takes more and more over-limit events to conclude that the power level was as high as indicated by the sampled data collected in state 303. Increasing the levelThreshold is a way to filter out spurious over-limit events and make the data collection state 303 more robust against noise or low-frequency carrier that is not filtered out, possibly because of a missing cap (not to be confused with low-frequency envelope modulation, like AM).

Then, in the exemplary embodiment of FIG. 3, arbiter 101 advances to the Decay Reset Rule (or "decay holdoff") state 305. In a sense, the decay holdoff state 305 is a type of look-ahead logic. It is looking at trends that have happened, and may thus alter whether the arbiter 101 takes some action based on past trends. For instance, if the power level was too high in the recent past, then even though it appears that the power could be increased at the present moment (e.g., to repair noise figure), decay holdoff 305 may advise that arbiter 101 should hold off from increasing the power due to the recently-observed high power level.

In general, the term "attack" is used to refer to addressing distortion (e.g., attacking distortion), and the term "decay" is used to refer to fixing noise performance. So, in this sense, when we refer to attack, we are reducing the gain, and when we refer to decay we are increasing the gain back up. In other words, the decay refers to decaying the attack action that was previously performed. Typically, systems desire to employ a fast attack and a slower decay. Accordingly, decay holdoff state 305 employs rules to avoid having to reverse an action at a later time due to changing (but predictable) conditions.

In general, the purpose of decay holdoff state 305 is to prevent irreversible distortion due to a combination of high power levels and attenuators with no available attenuation by recognizing and remembering temporary power levels that are close to distorting. This state 305 effectively provides the same effect as a peak-detect function. It is desirable for the arbiter 101 to recognize when subsequent gain increases could cause irreversible distortion and avoid that from happening. The arbiter 101 does not really have to detect peaks; it only needs to detect when the power level is at or above some reference that is getting close to distortion, in accordance with certain embodiments. By resetting the decay timer when this situation occurs (analogous to fast peak attack), the arbiter 101 can prevent future gain increases for a relatively long period (analogous to slow peak decay). We first recognized the need for this decay holdoff function for large AM. However, FM may need it too for large excursions in and out of the channel select filter bandwidth.

In one embodiment, decay timer/counters are reset when an observed power level is >=2 (with reference to the exemplary window levels 0-3 in FIG. 2). This captures two situations: 1) level 2 (which is desired and indicates that no increase in gain should occur), and 2) level 3 (distortion). Although there is an opportunity to reset decay counter/timers if this state did not exist in the state machine (i.e. when a distortion action, as discussed below, is taken), there is no such opportunity to reset decay counter/timers when level 2 is recognized, in accordance with certain embodiments. So, the main value of this state in certain embodiments is in recognizing level 2 and remembering it for some holdoff period to prevent, or holdoff, subsequent gain increases. Either way, it is generally desirable for the gain to not be increased in the short-term when there is no way to attenuate somewhere between the attenuator under consideration and the power detector at or above level 2.

In accordance with one embodiment, decay holdoff timers are employed to allow the decay rate counters to be decoupled from the constraint imposed by large, slow AM signals that traverse the entire detector window. For instance, in one embodiment two types of counter/timers are reset when the power level at a particular power detector is greater than or equal to a predefined set point:

1. decay holdoff timers (per attenuator). This is the basis for the decay holdoff timer feature, which allows for a fast AGC without following large, slow AM down to <10 Hz. It decouples decay rate from decay holdoff.

2. decay rate counters (per attenuator). Until the decay holdoff state 305 was added to the exemplary arbiter 101 of FIG. 3, the decay rate counters were used as the sole mechanism for preventing the AGC from following large, slow AM. Now that decay holdoff exists, decay rate reset is probably no longer needed, but it is still done for consistency. Notice that the rate counters themselves are still desirable to include (only the reset may not be necessary in certain implementations).

The next state is the choose action state 306. At this point, arbiter 101 chooses what action to take, if any, based on what it has observed. That is, in accordance with one embodiment, the arbiter 101 chooses from a list of actions what it wants to do based on the observed power levels. It should be recognized that arbiter 101 being implemented to choose an action out of a list of actions provides an advantageous feature of certain embodiments. For example, one embodiment affords symmetry of if-then statements and corresponding conditions that are implemented by the arbiter 101 for choosing an appropriate action at an appropriate time to, for example, optimize each stage in a manner that does not negatively impact downstream stages (e.g., as to minimize/eliminate oscillation and maximize SINAD and to minimize clock feedthrough).

In one embodiment, there are two categories of actions: 1) distortion fixing (or "attack") actions, and 2) noise restoring (or "decay") actions. For the list of distortion fixing (gain-decreasing) actions, the action list is searched downstream by power detector, with nested conditions ordered by upstream attenuators, in one embodiment. And, in one embodiment, for the list of noise restoring (gain-increasing) actions, the action list is searched downstream by attenuator, with non-nested conditions for all downstream power detectors.

In one embodiment, if the corresponding attack/decay rate counter is satisfied (e.g., meets some predefined value), the action will be realized in the next state (the update attenuator state 307); and if not, the attack/decay rate counter is incremented and no action will be realized this cycle through the states 302-307 (i.e., no action is taken in the next state 307). For actions that are designed to reduce distortion, the appropriate counter is an attack rate counter. For actions that are designed to restore noise performance, the appropriate counter is a decay rate counter.

In accordance with one embodiment of the present invention, arbiter 101 is implemented such that only one action is chosen per pass through the state machine loop (e.g., one pass through states 302-307). Thus, for instance, the one action to be taken may be chosen from the distortion fixing set of actions or from the noise restoring set of actions. In one embodiment, preference is given to the desired distortion reducing actions. So, if distortion exists at one stage and noise is present at another stage, in one embodiment the arbiter 101 will choose to fix the distortion rather than try to fix the noise in a single pass through the state loop. Of course, while only one action is permitted per pass in one embodiment, multiple (e.g., two) actions may be permitted per pass in other embodiments. For instance, in one embodiment, one action from each of the attack and decay categories of actions may be permitted in each pass.

In one embodiment, arbiter 101 uses the action list shown in the table (Table 1) below for choosing the action, if any, to be taken in choose action state 306.

| Action # | PWR DET/ATTN | RULE | DESCRIPTION | PRIMARY CONDITION | ANCILLARY CONDITIONS |
|---|---|---|---|---|---|
| | | | DESTORTION REDUCING ACTIONS | | |
| 1 | FM PD | DIST RULE (1, 1) | decrement PIN diode gain | WBPD is indicating distortion (i.e. WBPD = 3) | *Wideband attack counter satisfied |
| 2 | MIX PD | DIST RULE (2, 2) | decrement LNA gain | MBPD is indicating distortion (MBPD = 3) | *LNA not at min gain. *AND no previous actions triggered *AND midband attack counter is satisfied |
| 3 | | DIST RULE (2, 1) | decrement PIN diode gain | MBPD is indicating distortion (MBPD = 3), but the LNA is not able to reduce gain anymore | *PIN diode not at min gain *AND no previous actions triggered *AND wideband attack counter is satisfied |
| 4 | IF PD | DIST RULE (3, 3) | decrement VGA gain | NBPD is indicatingdistortion (NBPD = 3) | *VGA not at min gain *AND no previous actions triggered *AND narrowband attack counter is satisfied |
| 5 | | DIST RULE (3, 2) | decrement LNA gain | NBPD is indicating distortion (i.e. NBPD = 3), but VGA not able to reduce gain anymore | *LNA not at min gain. *AND no previous actions triggered, and *AND midband attack counter is satisfied |
| 6 | | DIST RULE (3, 1) | decrement PIN diode gain | NBPD is indicating distortion (i.e. NBPD = 3), but neither the VGA nor LNA are able to reduce gain anymore | *PIN diode not at min gain. *AND no previous actions triggered, and *AND wideband attack counter is satisfied |
| | | | NF RESTORING ACTIONS | | |
| 7 | PIN | NOISE RULE 1 | increment PIN diode gain | Power level at FM input is lower than target (i.e. WBPD < 2) Note: for AM, there is no primary condidtion since there is no front-end poer detector for AM | *PIN diode gain not moved out, *AND: the mixer would not be overloaded by an increase in gain (MBPD < 2) or (break-fix): the LNA can alternate (later) *AND: the ADC would not be overloaded by an increase in gain (NBPD < 2) or (break-fix): the VGA can alternate (later) or the LNA can alternate (later) *AND wideband decay counter satisfied |
| 8 | LNA | NOISE RULE 2 | increment LNA gain | The power level at the MIXER input is lower than the target (i.e. MBPD < 2) | *LNA gain not maxed out, *AND: the ADC would not be overloaded by an increase in gain (NBPD < 2) or (break-fix): the VGA can alternate (later) *AND no previous actions triggered *AND midband decay counter is satisfied |
| 9 | VGA | NOISE RULE 3 | increment VGA gain | The power level at the ADC input is lower than the lowest window level (i.e. NBPD=0) | *VGA gain is not maxed out *AND no previous actions triggered *AND narrowband decay counter is satisfied |

It should be noted that in this exemplary embodiment, the number of distortion reducing actions, $N_{DA}$, scales non-linearly with the number of power detectors ($N_{PD}$) and is given by:

$$N_{DA} = \frac{N_{PD(N_{PD}+1)}}{2}.$$

For example, in the exemplary implementation in which there are three power domains and three power detectors:

$$N_{DA} = \frac{3(3+1)}{2} = 6.$$

On the other hand, in this exemplary embodiment, the number of noise reducing actions ($N_{NA}$) scales linearly with the number of attenuators, NA: $N_{NA}=N_A$; and the number of conditions within the corresponding if-then statements scales non-linearly with the number of attenuators. The total number of actions in this exemplary embodiment is given by:

$$N = \frac{N_{PD(N_{PD}+1)}}{2} + N_A.$$

According to one exemplary embodiment, for instance, arbiter 101 may step through the action list from actions number 1 to action number 9 and determines whether the corresponding conditions for a rule are satisfied. In one embodiment, only a single action is permitted per pass through the states, and so the first action (from 1 to 9) whose conditions are satisfied is chosen. Actions 1-6 in the above table are distortion fixing (or "attack") actions, and actions 7-9 are noise restoring (or "decay") actions. In one embodiment, a single action is permitted from each category per pass through the states, and so the first one of actions 1-6 whose conditions are satisfied and the first one of actions 7-9 whose conditions are satisfied may be chosen.

Action 1 is associated with the WB power detector 106, actions 2-3 are associated with the MB power detector 107, and actions 4-6 are associated with the NB power detector 108, in this example. Selection and performance of the actions in accordance with one embodiment are described further below with reference to FIGS. 4A-4B.

The next state in this exemplary embodiment is the update attenuators state 307. In this state, the chosen action (if one was chosen) in state 306 is performed. For instance, a chosen action may be performed in state 307 by the arbiter 101 strobing out an increase or decrease command to the appropriate attenuator (for either increasing or decreasing the attenuation). Due to the basic tenet of a preferred embodiment of only changing one attenuator at a time, only one attenuator is updated in this state 307 in accordance with a preferred embodiment. Of course, in other embodiments multiple actions may be chosen in state 306 and performed in state 307 on one or more of attenuators 103-105.

Figure 6A:
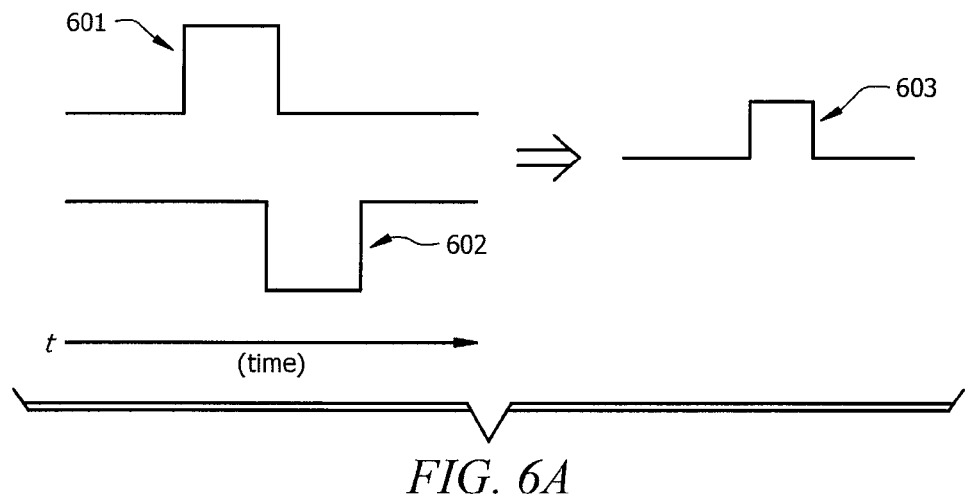
FIGS. 6A-6B show examples of clock feedthrough disturbance, and no clock feedthrough disturbance, respectively.
Figure 6B:
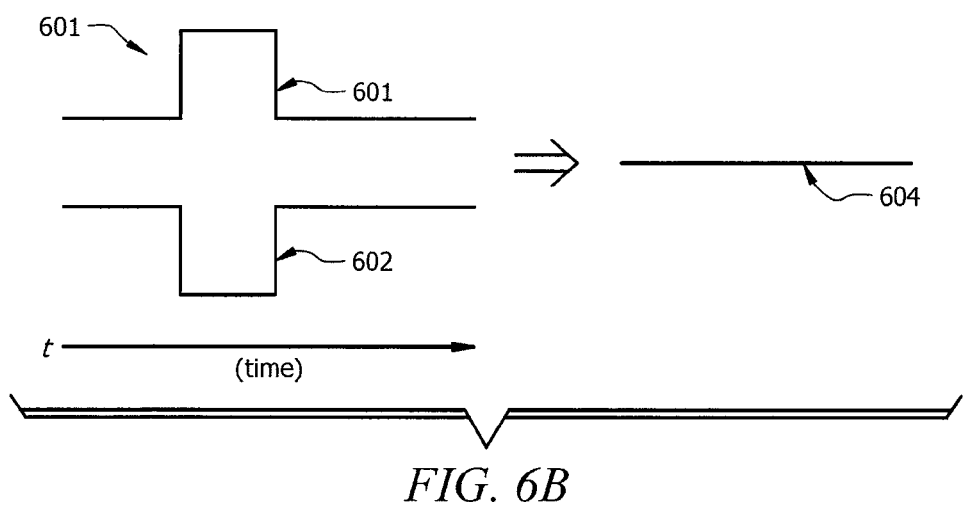

In one exemplary implementation of the arbiter state machine, one distortion and/or noise action is performed at a time. This provides for simplicity in that no gain replacement is required in its operation. A potential disadvantage of this approach is clock feedthrough. FIGS. 6A-6B show a simple illustration of clock feedthrough. As shown in FIG. 6A, clock feedthrough occurs in the example shown. More specifically, at a first point in time a noise correction action 601 is taken (e.g., by increasing gain in a gain stage of a series), and then at a later time a distortion correction action 602 is taken (e.g., by decreasing gain in a gain stage of the series). As a result of the time between taking the actions 602 and 602, an undesired disturbance 603 in the signal output by the series of gain stages. In FIG. 6B, however, clock feedthrough is addressed by performing the noise correction action 601 and distortion correction action 602 at the same time, thereby alleviating the disturbance in the output signal 604 of the series of gain stages.

To restore noise figure (NF), the gain has to flow upstream. Without gain replacement, the arbiter 101 may temporarily cause (reversible) distortion. The condition that must be met before the design can "break" linearity is that the gain increase that the arbiter is about to make must be reversible somewhere downstream; i.e., there must be at least one attenuator with the ability to attenuate between the attenuator under consideration and the power detector that is close to distortion. This is referred to as a "break-fix" opportunity, but it causes clock feedthrough, unlike simultaneous gain replacement.

In one exemplary implementation, scan priority decreases as you go downstream—both in eliminating distortion and restoring NF. As for distortion reduction:

Power detectors are scanned in line-up order.

The first one showing distortion gets the action.

Which action depends on which attenuator is linked to the power detector; i.e. the first one that can attenuate looking upstream.

As for NF restoration in one exemplary implementation:

1. Attenuators are scanned in line-up order.

2. The first attenuator that can increase gain without causing irreversible distortion gets the action.

3. An attenuator will not cause irreversible distortion if it is not linked to a power detector greater than or equal to level 2.

4. In other words, there is an attenuator with attenuation left between it and all downstream power detectors.

According to one exemplary implementation of the arbiter state machine, the current action is not dependent on previous action (to avoid dwelling). The arbiter goes through the action list from beginning to end on every update. The previous action is not recorded and does not influence the next action directly; only the effects of the previous action on the system can influence the next action, indirectly. The only data that influence the next action are 1) current power levels and 2) whether or not the attenuators are min'ed/max'ed. Having the previous action directly influence the next action can worsen the "clock feedthrough" effect. For example, if a previous-action-dependent algorithm sees that one power detector is out of its window, it might dwell on making that power detector happy, ignoring what is happening to the rest of the lineup. No dwelling helps at least two cases:

reduces temporary intermodulation: If a level is too low, a dwelling algorithm would increase gain until that detector is happy, even though downstream blocks are getting crushed. Although the algorithm would fix the distortion afterwards, temporary IM occurred. A non-dwelling algorithm could detect the distortion as soon as it happened, abandon the gain increases and focus on reducing the distortion immediately. In certain embodiments, an arbiter employing the exemplary states/flow of FIG. 3 is effective at reducing temporary IM because it is non-dwelling and distortion always trumps noise.

reduces temporary blocking: If a level is too high, a dwelling algorithm would decrease gain until that detector is happy, even though downstream signal levels are getting too low. In certain embodiments, an arbiter employing the exemplary states/flow of FIG. 3 is ineffective at temporary blocking, not because it is non-dwelling, but because only one action is allowed at a time and distortion trumps noise.

Figure 4A:
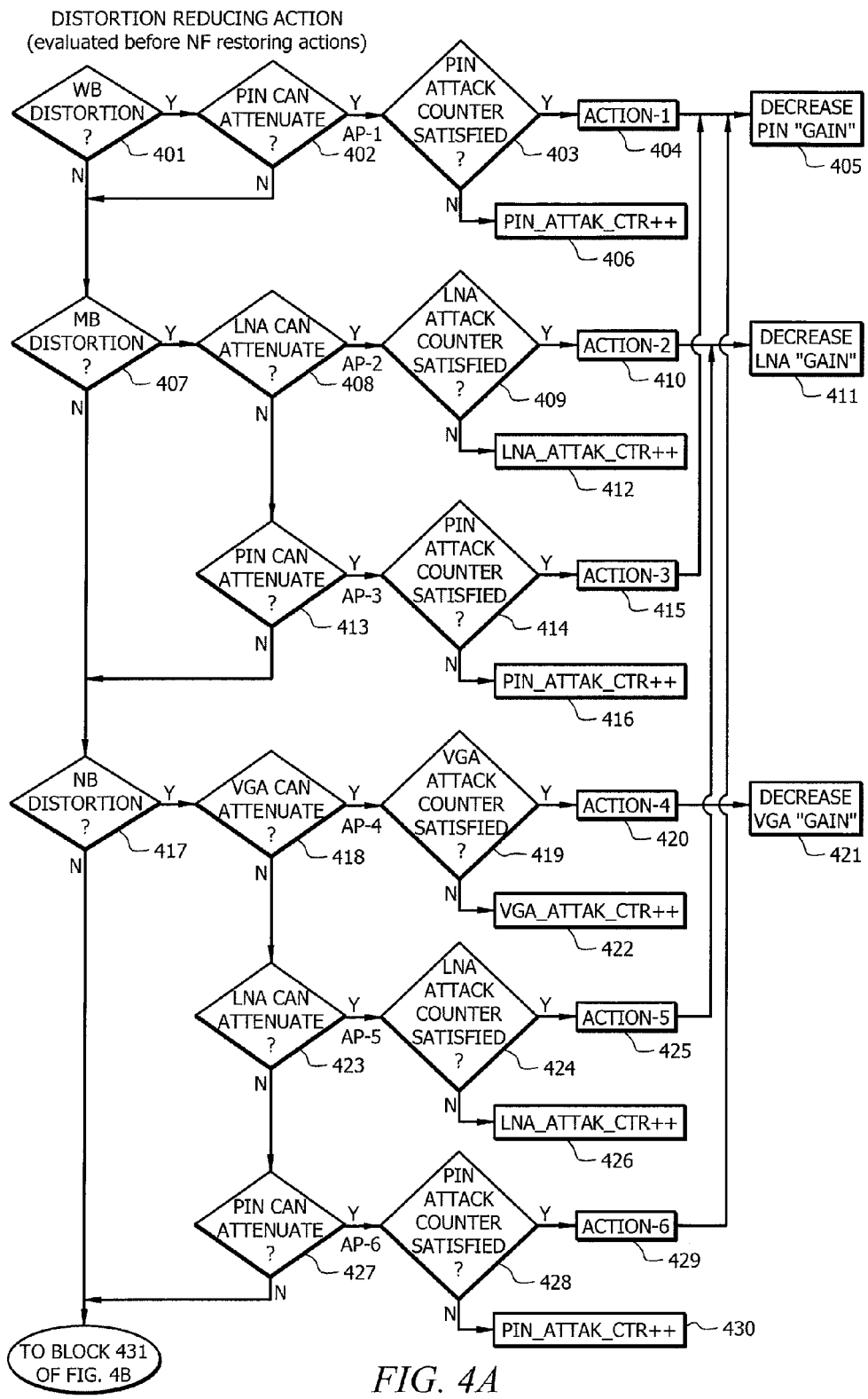
FIGS. 4A-4B show an exemplary operational flow diagram for a central arbiter in evaluating power level data and choosing an action to take for managing a series of power adjustment circuits/stages in accordance with one embodiment of the present invention.
Figure 4B:
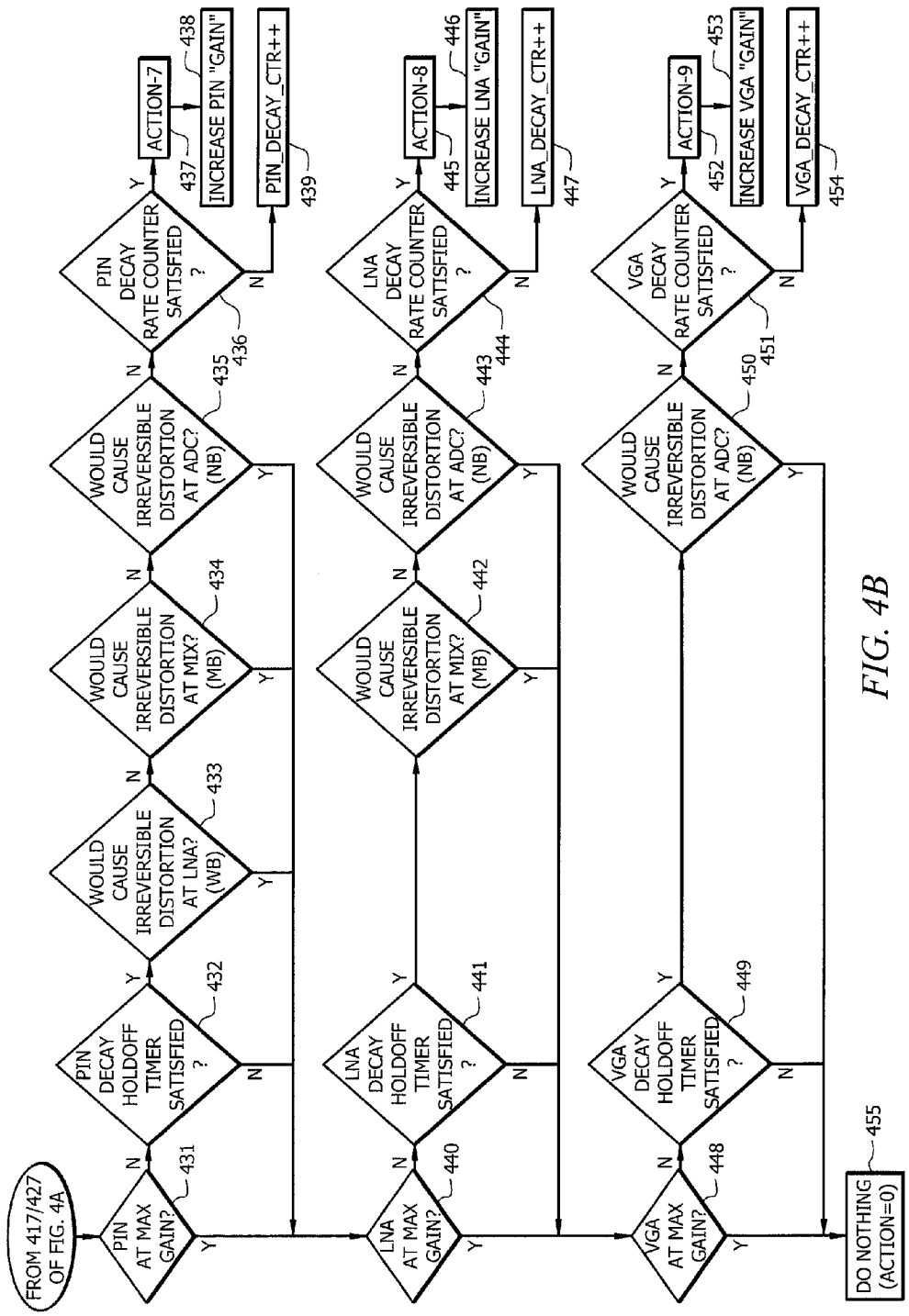

Turning now to FIGS. 4A-4B, an exemplary operational flow diagram for arbiter 101 in evaluating power level data (e.g., as may be collected in state 303 and summarized in state 304 of FIG. 3) and choosing an action to take for managing a series (e.g., series 102 of FIGS. 1 and 3 or series 202 of FIG. 2) of power adjustment circuits/stages is shown. Beginning with FIG. 4A, arbiter 101 first addresses distortion. That is, in one embodiment, distortion fixing actions take precedent. In operational block 401, arbiter 101 determines whether WB distortion is observed. That is, arbiter 101 determines whether the power detected by WB power detector 106 of FIGS. 1 and 3 is indicative of distortion (e.g., is at level 3). If not, operation advances to block 407 discussed below. If yes, operation advances to block 402 where arbiter 101 determines whether the first attenuator (PIN) 103 can attenuate. If not, then operation advances to block 407 discussed below. If yes, operation advances to block 403 where arbiter 101 determines whether an attack counter variable for the first attenuator 103 satisfies a predefined counter value/threshold. If not, the attack counter variable for the first attenuator 103 is incremented in block 406. If the attack counter variable satisfies the predefined counter value/threshold in block 403, then operation advances to block 404 where arbiter 101 chooses action 1 from Table 1 above, and in operation 405 sends a decrease strobe command to the first attenuator 103 to cause it to decrease its gain (in accordance with the chosen action 1).

In operational block 407, arbiter 101 determines whether the power detected by MB power detector 107 of FIGS. 1 and 3 is indicative of distortion (e.g., is at level 3). If not, operation advances to block 417 discussed below. If yes, operation advances to block 408 where arbiter 101 determines whether the second attenuator (LNA) 104 can attenuate. If not, then operation advances to block 413 discussed below. If yes, operation advances to block 409 where arbiter 101 determines whether an attack counter variable for the second attenuator 104 satisfies a predefined counter value/threshold. If not, the attack counter variable for the second attenuator 104 is incremented in block 412. If the attack counter variable satisfies the predefined counter value/threshold in block 409, then operation advances to block 410 where arbiter 101 chooses action 2 from Table 1 above, and in operation 411 sends a decrease strobe command to the second attenuator 104 to cause it to decrease its gain (in accordance with the chosen action 2).

If operation advances to block 413 from block 408, then in block 413 arbiter 101 determines whether the first attenuator (PIN) 103 can attenuate. If not, then operation advances to block 417 discussed below. If yes, operation advances to block 414 where arbiter 101 determines whether an attack counter variable for the first attenuator 103 satisfies a predefined counter value/threshold. If not, the attack counter variable for the first attenuator 103 is incremented in block 416. If the attack counter variable satisfies the predefined counter value/threshold in block 414, then operation advances to block 415 where arbiter 101 chooses action 3 from Table 1 above, and thus sends a decrease strobe command to the first attenuator 103 to cause it to decrease its gain (in accordance with the chosen action 1) in operation 405.

In operational block 417, arbiter 101 determines whether the power detected by NB power detector 108 of FIGS. 1 and 3 is indicative of distortion (e.g., is at level 3). If not, operation advances to block 431 of FIG. 4B discussed below. If yes, operation advances to block 418 where arbiter 101 determines whether the third attenuator (VGA) 105 can attenuate. If not, then operation advances to block 423 discussed below. If yes, operation advances to block 419 where arbiter 101 determines whether an attack counter variable for the third attenuator 105 satisfies a predefined counter value/threshold. If not, the attack counter variable for the third attenuator 105 is incremented in block 422. If the attack counter variable satisfies the predefined counter value/threshold in block 419, then operation advances to block 420 where arbiter 101 chooses action 4 from Table 1 above, and in operation 421 sends a decrease strobe command to the third attenuator 105 to cause it to decrease its gain (in accordance with the chosen action 4).

If operation advances to block 423 from block 418, then in block 423 arbiter 101 determines whether the second attenuator (LNA) 104 can attenuate. If not, then operation advances to block 427 discussed below. If yes, operation advances to block 424 where arbiter 101 determines whether an attack counter variable for the second attenuator 104 satisfies a predefined counter value/threshold. If not, the attack counter variable for the second attenuator 104 is incremented in block 426. If the attack counter variable satisfies the predefined counter value/threshold in block 424, then operation advances to block 425 where arbiter 101 chooses action 5 from Table 1 above, and thus sends a decrease strobe command to the second attenuator 103 to cause it to decrease its gain (in accordance with the chosen action 5) in operation 411.

If operation advances to block 427 from block 423, then in block 427 arbiter 101 determines whether the first attenuator (PIN) 103 can attenuate. If not, then operation advances to block 431 of FIG. 4B discussed below. If yes, operation advances to block 428 where arbiter 101 determines whether an attack counter variable for the first attenuator 103 satisfies a predefined counter value/threshold. If not, the attack counter variable for the first attenuator 103 is incremented in block 430. If the attack counter variable satisfies the predefined counter value/threshold in block 428, then operation advances to block 429 where arbiter 101 chooses action 6 from Table 1 above, and thus sends a decrease strobe command to the first attenuator 103 to cause it to decrease its gain (in accordance with the chosen action 6) in operation 405.

Turning to FIG. 4B, arbiter 101 next addresses noise. That is, in one embodiment, a noise correcting action may be taken if no distortion fixing action is taken in FIG. 4A. Of course, in other embodiments both a distortion fixing action and a noise correction action may be taken simultaneously (e.g., in a single cycle through the state machine of FIG. 3). In operational block 431, arbiter 101 determines whether the first attenuator (PIN) 103 is at its maximum gain (or minimum attenuation). If yes, operation advances to block 440 discussed below. If no, operation advances to block 432 where arbiter 101 determines whether a decay holdoff timer for the first attenuator 103 is satisfied. If not, operation advances to block 440 discussed below. If the first attenuator's decay holdoff timer satisfies a predefined value in block 432, then operation advances to block 433 where arbiter 101 determines whether increasing the gain of the first attenuator 103 would cause irreversible distortion at the second attenuator (LNA) 104 (e.g., distortion that the second attenuator 104 cannot itself correct). If yes, then operation advances to block 440 discussed below. If not, then operation advances to block 434 where arbiter 101 determines whether increasing the gain of the first attenuator 103 would cause irreversible distortion at midband power detector (MB PD) 107, 212. If yes, then operation advances to block 440 discussed below. If not, then operation advances to block 435 where arbiter 101 determines whether increasing the gain of the first attenuator 103 would cause irreversible distortion at narrow-band power detector (NB PD) 108, 214. If yes, then operation advances to block 440 discussed below. If not, operation advances to block 436 where arbiter 101 determines whether a decay rate counter variable for the first attenuator 103 satisfies a predefined threshold. If not, then the decay rate counter variable for the first attenuator 103 is incremented in block 439. If the first attenuator's decay rate counter variable satisfies the predefined threshold, then operation advances to block 437 where arbiter 101 chooses action 7 from Table 1 above, and then sends an increase strobe command to the first attenuator 103 to cause it to increase its gain (in accordance with the chosen action 7) in operation 438.

In operational block 440, arbiter 101 determines whether the second attenuator (LNA) 104 is at its maximum gain. If yes, operation advances to block 448 discussed below. If no, operation advances to block 441 where arbiter 101 determines whether a decay holdoff timer for the second attenuator 104 is satisfied. If not, operation advances to block 448 discussed below. If the second attenuator's decay holdoff timer satisfies a predefined value in block 441, then operation advances to block 442 where arbiter 101 determines whether increasing the gain of the second attenuator 104 would cause irreversible distortion at MB PD 107, 212. If yes, then operation advances to block 448 discussed below. If not, then operation advances to block 443 where arbiter 101 determines whether increasing the gain of the second attenuator 104 would cause irreversible distortion at NB PD 108, 214. If yes, then operation advances to block 448 discussed below. If not, operation advances to block 444 where arbiter 101 determines whether a decay rate counter variable for the second attenuator 104 satisfies a predefined threshold. If not, then the decay rate counter variable for the second attenuator 104 is incremented in block 447. If the second attenuator's decay rate counter variable satisfies the predefined threshold, then operation advances to block 445 where arbiter 101 chooses action 8 from Table 1 above, and then sends an increase strobe command to the second attenuator 104 to cause it to increase its gain (in accordance with the chosen action 8) in operation 446.

In operational block 448, arbiter 101 determines whether the third attenuator (VGA) 105 is at its maximum gain. If yes, operation advances to block 455 where a do nothing action (action 0) is chosen by arbiter 101 for this cycle through the state machine loop of FIG. 3. If no, operation advances to block 449 where arbiter 101 determines whether a decay holdoff timer for the third attenuator 105 is satisfied. If not, operation advances to block 455 for selection of the do nothing action. If the third attenuator's decay holdoff timer satisfies a predefined value in block 449, then operation advances to block 450 where arbiter 101 determines whether increasing the gain of the third attenuator 105 would cause irreversible distortion at NB PD 108, 214. If yes, then operation advances to block 455 for selection of the do nothing action. If not, operation advances to block 451 where arbiter 101 determines whether a decay rate counter variable for the third attenuator 105 satisfies a predefined threshold. If not, then the decay rate counter variable for the third attenuator 105 is incremented in block 454. If the third attenuator's decay rate counter variable satisfies the predefined threshold, then operation advances to block 452 where arbiter 101 chooses action 9 from Table 1 above, and then sends an increase strobe command to the third attenuator 105 to cause it to increase its gain (in accordance with the chosen action 9) in operation 453.

In accordance with certain embodiments, situations may arise where the arbiter 101 may choose an action (in state 306 of FIG. 3) that will not actually be realized (e.g., will not be performed in the next state 307). So, in certain embodiments, there is concept referred to as action potential, which means that the arbiter 101 has recorded its desire to take an action but is not going to actually realize it until it has cycled around the state loop several times and added up a certain number of those desires (e.g., to satisfy the counters mentioned in FIGS. 4A-4B). This provides an effective way to have programmable attack and decay rates. So, for example, a different counter depth may be implemented for the WB attenuator 103 than for the other attenuators, and based on how fast the arbiter 101 cycles through its state loop (states 302-307 of FIG. 3), it may have to actually choose a particular action several times (e.g., four times) before it actually realizes it (in state 307).

Another concept that is introduced in accordance with certain embodiments of the present invention pertains to dithering. Suppose, for instance, that a system (such as one of those shown in FIGS. 1-3) is implemented for a car radio system, and further suppose that the car travels through a tunnel. As a result, the system may desire to try to increase gain because the signal faded. So, in one embodiment, the system will try to increase the gain as fast as it can. For instance, as fast as it can cycle through the state machine and then accumulate the actual potentials, then arbiter 101 is going to realize the chosen actions. Because that happens on a period bases the net result could be heard. So, there is dithering to break up periodic adjustments in power level such that the net result is the same as without dithering, but instantaneous gain changes vary, similar to a sigma/delta, to smooth out the net.

Figure 5:
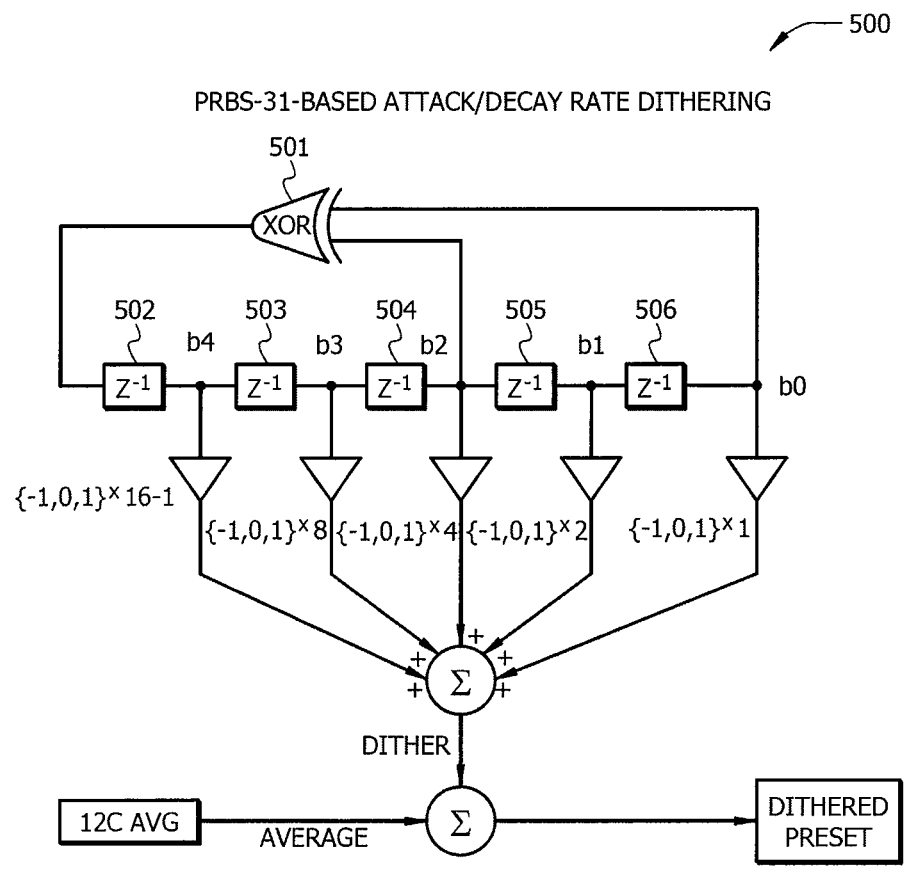
FIG. 5 shows a block diagram of an exemplary implementation for providing attack/decay rate dithering in accordance with one embodiment of the present invention.
Figure 7A:
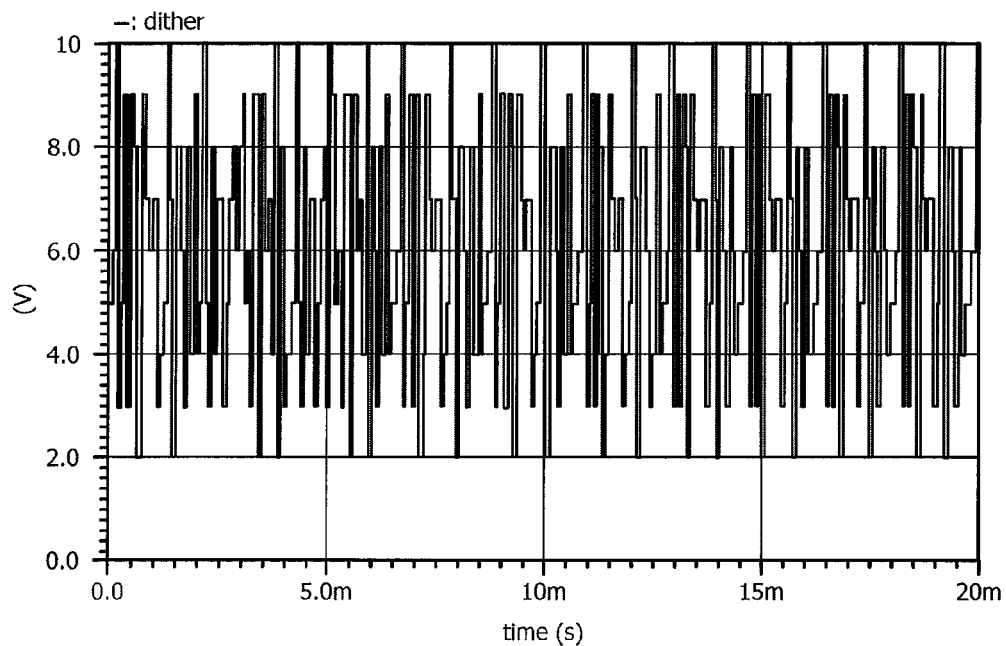
FIGS. 7A-7B show exemplary graphs for instantaneous delay (for dithering) and average delay over time, respectively, in accordance with one exemplary implementation (as may be implemented by the circuitry of FIG. 5).
Figure 7B:
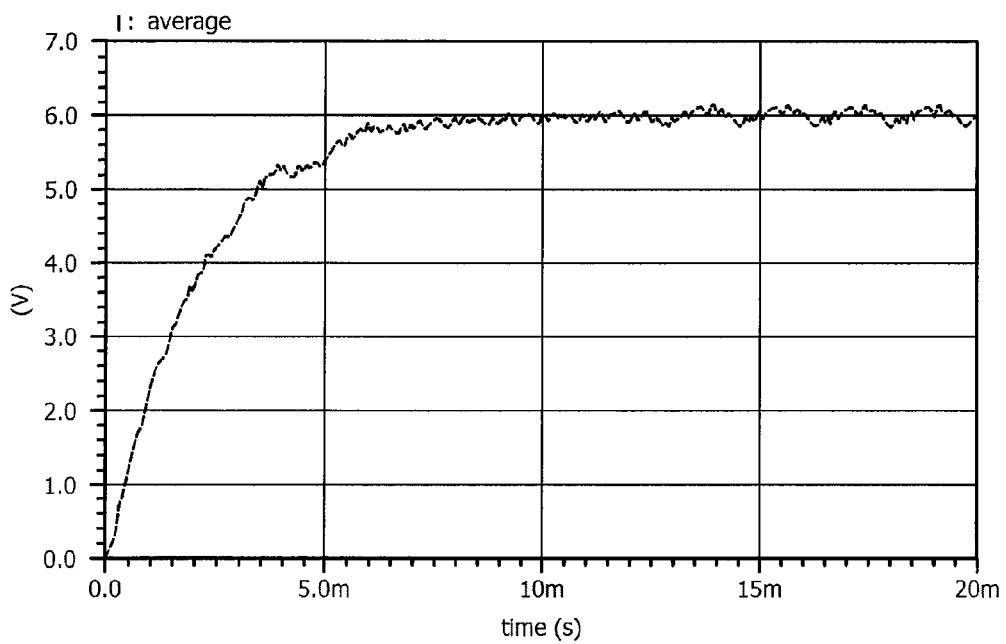

Turning to FIG. 5, an exemplary implementation for providing attack/decay rate dithering in accordance with one embodiment is shown. In this example, a pseudo-random binary sequence (PRBS) generator is employed. Exemplary system 500 implements an FIR filter with 5 delay elements 502-506 and an XOR feedback 501. In this exemplary embodiment, every time that an action fires, the bit b0 advances through the PRBS loop, generating the next dithered preset (different number of times the arbiter must "want" to fire the action before it actually does so). Elements 507-511 are taps or weights (e.g., binary weighted). As one example, an average preset may equal some number (e.g., 6), but instantaneous presets may vary over time, in accordance with one embodiment. For instance, in operation of one embodiment, suppose that the preset is 5. Arbiter 101 accumulates 5 instances where the action under consideration should fire (be realized) if not constrained by attack/decay rate constraints, before it does actually fire. Upon accumulating the 5 instances, arbiter 101 fires the action and a new preset (e.g., equal to 6) is generated (e.g., the state machine in FIG. 5 advances 1 time). Arbiter 101 then accumulates 6 instances where the action under consideration should fire (be realized) if not constrained by attack/decay rate constraints, before it does actually fire. Upon accumulating the 6 instances, arbiter 101 fires the action and a new preset is generated (e.g., equal to 10). Operation may continue in a similar manner to vary the instantaneous presets that are employed for dithering over time, such as shown in FIG. 7A. Looking at the average preset over many trials, an average preset of, say, 6 may be determined, such as shown in the example of FIG. 7B.

In one or more exemplary designs, the functions described (e.g., as being performed in the states 301-307 of the state machine of FIG. 3 and/or as being performed by arbiter 101 in FIGS. 4A-4B) may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In view of the above, certain embodiments of the present invention employ a centralized arbiter for individually controlling stages of a series of gain stages in a coordinated fashion (e.g., based on power level information observed for the output of each, or at least a plurality of, the stages). Such a central arbiter can thus be effectively used for AGC. Any one or more of various advantages may be recognized through use of such an arbiter-based AGC, such as one or more of:

1) maximizes SINAD in a well-organized, well-understood fashion;
2) prevents oscillations, by design;
3) scalable for any number of stages;
4) may be digitally synthesized to take advantage of scaling features sizes of digital technologies;
5) may be executed at a speed that is programmable (e.g. faster for temporary signal quality checking and slower for persistent tuning);
6) able to report actions taken at every clock cycle and why, making debug, test and understanding simpler;
7) programmable action rates, per attenuator;
8) programmable hold-off feature to decouple action rates from lowest frequency allowed to pass (not followed or tracked-out); and/or
9) allows freezing of individual attenuators and algorithm considers the implication when choosing actions.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A system comprising:
   a series of gain stages each comprising at least one power adjustment circuit; and
   a central arbiter device for monitoring power output of a plurality of said gain stages and controlling a respective gain amount of each of the plurality of said gain stages,
   wherein said central arbiter device is operatively connected to make a prediction whether increasing gain at an upstream gain stage of said series of gain stages would cause irreversible distortion at a downstream gain stage of said series of gain stages, and control respective gain amounts of said upstream gain stage and said downstream gain stage conditioned on an outcome of said prediction, including incrementally increase gain at the upstream gain stage at a rate that accommodates incremental decrease of gain at the downstream gain stage in order to reverse distortion at the downstream gain stage;
   a plurality of predefined actions for said arbiter to trigger for correcting distortion in one or more of the gain stages; and
   a plurality of predefined actions for said arbiter to trigger for correcting noise in one or more of the gain stages;
   wherein priority is given to said predefined actions for correcting distortion over said predefined actions for correcting noise.

2. The system of claim 1 wherein said at least one power adjustment circuit comprises at least one of an attenuator and an amplifier.

3. The system of claim 1 wherein said series of gain stages each comprises an attenuator.

4. The system of claim 1 wherein said series of gain stages comprises three of said gain stages each comprising a power adjustment circuit.

5. The system of claim 4 wherein each of said gain stages comprises an attenuator.

6. The system of claim 1 further comprising:
   a plurality of power detectors for detecting power output by said plurality of said gain stages.

7. The system of claim 6 further comprising:
   window detectors for characterizing each of a plurality of samples of the power detected by each of said power detectors over a period of time into one of a plurality of different levels.

8. The system of claim 7 wherein said plurality of different levels comprises at least a low level, acceptable level, and high level.

9. The system of claim 1 wherein said arbiter device comprises a state machine.

10. The system of claim 9 wherein said state machine comprises at least a state for collecting data about said power output by said plurality of said gain stages, a state for choosing based at least in part on the collected data an action to instruct at least one of said gain stages to take, and a state for instructing at least one of said gain stages to take a chosen action.

11. The system of claim 10 wherein said predefined actions for correcting distortion and said predefined actions for correcting noise are prioritized from upstream to downstream in the series of gain stages.

12. The system of claim 10 wherein the state machine is configured to trigger, at most, one action to be taken in the series of gain stages per cycle through a loop of said states.

13. The system of claim 12 wherein said state machine is configured to trigger, at most, either a gain increase action or a gain decrease action to one stage of the series of gain stages.

14. The system of claim 13 wherein an action determined by said arbiter to be performed in an upstream gain stage of the series of gain stages is given priority over an action determined by said arbiter for a downstream gain stage of the series of gain stages.

15. The system of claim 10 wherein said state machine is configured to trigger, at most, two actions to be taken in the series of gain stages per cycle through a loop of said states; and wherein said two actions comprise either a gain increase action in one of said series of gain stages, a gain decrease action in one of the series of gain stages, or a gain increase action in one of the series of gain stages and a gain decrease action in another one of the series of gain stages.

16. The system of claim 10 wherein in choosing said action, an action for an upstream gain stage of the series of gain stages is given priority over an action for a downstream gain stage of the series of gain stages.

17. The system of claim 10 wherein said state machine is configured to employ a delay such that said arbiter performs said instructing to take said action only after said action is chosen in multiple cycles through the states.

18. A radio system comprising:
a front-end receiver for receiving a radio frequency (RF) signal, said front-end receiver comprising a series of gain stages each comprising at least one attenuator;
a plurality of power detectors, each power detector for detecting power output of a respective one of a plurality of said gain stages;
a central arbiter device for controlling, based at least in part on the detected power output of said plurality of said gain stages, attenuation of the attenuators,
wherein said central arbiter device is operatively connected to make a prediction whether increasing gain at an upstream gain stage of said series of gain stages would cause irreversible distortion at a downstream gain stage of said series of gain stages, and control the attenuation of the attenuators of the upstream gain stage and the downstream gain stage conditioned on an outcome of said prediction, including incrementally increase gain at the upstream gain stage at a rate that accommodates incremental decrease of gain at the downstream gain stage in order to reverse distortion at the downstream gain stage;
a plurality of redefined actions for said arbiter to trigger for correcting distortion in one or more of the gain stages; and
a plurality of predefined actions for said arbiter to trigger for correcting noise in one or more of the gain stages;
wherein priority is given to said predefined actions for correcting distortion over said predefined actions for correcting noise; and wherein said predefined actions for correcting distortion and said predefined actions for correcting noise are prioritized from upstream to downstream in the series of gain stages.

19. The radio system of claim 18 further comprising:
window detectors for characterizing each of a plurality of samples of the power detected by each of said power detectors over a period of time into one of a plurality of different levels.

20. The radio system of claim 19 wherein said plurality of different levels comprises at least a low level, acceptable level, and high level.

21. The radio system of claim 18 wherein said arbiter device comprises a state machine.

22. The radio system of claim 21 wherein said state machine comprises at least a state for collecting data about said power output by said plurality of said gain stages, a state for choosing based at least in part on the collected data an action to instruct at least one of said gain stages to take, and a state for instructing at least one of said gain stages to take a chosen action.

23. A method comprising:
receiving, at a central arbiter device, information about power level of respective output signals for each of a series of gain stages, where each of said gain stages comprises at least one power adjustment circuit;
determining, by said central arbiter device, based at least in part on said received information, whether to alter an amount of gain of one or more of said gain stages; and
when determined to alter said amount of gain of said one or more of said gain stages, instructing by said central arbiter device said one or more of said gain stages to adjust its amount of gain,
wherein said determining includes making a prediction whether increasing gain at an upstream gain stage of said series of gain stages would cause irreversible distortion at a downstream gain stage of said series of gain stages, and conditioning adjustment of amounts of gain of the upstream gain stage and the downstream gain stage on an outcome of the prediction, including incrementally increasing gain at the upstream gain stage at a rate that accommodates incremental decrease of gain at the downstream gain stage in order to reverse distortion at the downstream gain stage.

24. The method of claim 23 further comprising:
characterizing each of a plurality of samples of power detected by each of a plurality of power detectors over a period of time into one of a plurality of different levels.

25. The method of claim 24 wherein said plurality of different levels comprises at least a low level, acceptable level, and high level.

26. The method of claim 23 wherein said arbiter device comprises a state machine having at least a state for collecting data about said power output by said plurality of said gain stages, a state for choosing based at least in part on the collected data an action to instruct at least one of said gain stages to take, and a state for instructing at least one of said gain stages to take a chosen action.

* * * * *

UNITED STATES PATENT AND TRADEMARK OFFICE
CERTIFICATE OF CORRECTION

| | | |
|---|---|---|
| PATENT NO. | : 8,983,416 B1 | Page 1 of 1 |
| APPLICATION NO. | : 12/946625 | |
| DATED | : March 17, 2015 | |
| INVENTOR(S) | : Ronald G. Spencer | |

It is certified that error appears in the above-identified patent and that said Letters Patent is hereby corrected as shown below:

In the Claims:

At column 23, claim number 18, line number 50, delete "redefined" and replace with --predefined--.

Signed and Sealed this
Thirtieth Day of June, 2015

Michelle K. Lee
*Director of the United States Patent and Trademark Office*